United States Patent
Maggioni

(10) Patent No.: US 10,761,113 B2
(45) Date of Patent: Sep. 1, 2020

(54) PROBE CARD FOR A TESTING APPARATUS OF ELECTRONIC DEVICES WITH ENHANCED FILTERING PROPERTIES

(71) Applicant: TECHNOPROBE S.p.A., Cernusco Lombardone (IT)

(72) Inventor: Flavio Maggioni, Cernusco Lombardone (IT)

(73) Assignee: TECHNOPROBE S.P.A., Cernusco Lombardone (IT)

( * ) Notice: Subject to any disclaimer, the term of this patent is extended or adjusted under 35 U.S.C. 154(b) by 282 days.

(21) Appl. No.: 15/718,561

(22) Filed: Sep. 28, 2017

(65) Prior Publication Data

US 2018/0024167 A1    Jan. 25, 2018

Related U.S. Application Data

(63) Continuation-in-part of application No. PCT/EP2016/056658, filed on Mar. 24, 2016.

(30) Foreign Application Priority Data

Mar. 31, 2015 (IT) ......................... 102015000010473

(51) Int. Cl.
*G01R 1/073* (2006.01)
*G01R 31/28* (2006.01)
*H05K 1/02* (2006.01)
*G01R 1/067* (2006.01)

(52) U.S. Cl.
CPC ..... *G01R 1/07378* (2013.01); *G01R 1/07342* (2013.01); *G01R 31/2889* (2013.01); *G01R 1/06766* (2013.01); *H05K 1/0231* (2013.01)

(58) Field of Classification Search
CPC .............. G01R 1/0416; G01R 1/06727; G01R 31/2868; G01R 31/2893; G01R 31/2896
See application file for complete search history.

(56) References Cited

U.S. PATENT DOCUMENTS

| 6,713,860 B2 | 3/2004 | Li |
| 7,279,911 B2 | 10/2007 | Tunaboylu |
| 2002/0067181 A1* | 6/2002 | Eldridge .............. B23K 20/004 324/756.03 |
| 2004/0224148 A1 | 11/2004 | Matsunaga |

(Continued)

FOREIGN PATENT DOCUMENTS

| JP | 3000557 B1 | 1/2000 |
| JP | 3543765 B2 | 7/2004 |

(Continued)

*Primary Examiner* — Tung X Nguyen
(74) *Attorney, Agent, or Firm* — Seed Intellectual Property Law Group LLP

(57) ABSTRACT

A probe card for a testing apparatus of electronic devices comprises at least one testing head housing a plurality of contact probes, each contact probe having at least one contact tip abutting onto contact pads of a device under test, as well as at least one space transformer realizing a spatial transformation of the distances between contact pads made on its opposite sides and connected by means of suitable conductive tracks or planes, as well as a plurality of filtering capacitors provided between the space transformer and a PCB, which comprises direct conductive tracks or planes contacting conductive portions of the filtering capacitors.

26 Claims, 4 Drawing Sheets

(56) References Cited

U.S. PATENT DOCUMENTS

| | | |
|---|---|---|
| 2005/0156611 A1 | 7/2005 | Shinde et al. |
| 2006/0038576 A1 | 2/2006 | Tadayon |
| 2006/0250150 A1* | 11/2006 | Tunaboylu ......... G01R 1/07378 324/756.03 |
| 2007/0145989 A1 | 6/2007 | Zhu |
| 2007/0178727 A1* | 8/2007 | Igarashi ............. G01R 1/07314 439/91 |
| 2007/0228110 A1 | 10/2007 | Eldridge et al. |
| 2007/0247175 A1 | 10/2007 | Khandros et al. |
| 2014/0028341 A1 | 1/2014 | Mikuni et al. |
| 2014/0283379 A1 | 9/2014 | Russell |

FOREIGN PATENT DOCUMENTS

| | | |
|---|---|---|
| JP | 2011-228727 A | 11/2011 |
| WO | 2012/106221 A1 | 8/2012 |

\* cited by examiner

PROBE CARD FOR A TESTING APPARATUS OF ELECTRONIC DEVICES WITH ENHANCED FILTERING PROPERTIES

BACKGROUND

Technical Field

The present disclosure refers to a probe card for a testing apparatus of electronic devices.

The disclosure refers in particular, but not exclusively, to a probe card with enhanced frequency performances and the following description is made with reference to this field of application with the only purpose of simplifying its exposition.

Description of the Related Art

As it is well known, a probe card is a device apt to place a plurality of contact pads of a microstructure, in particular an electronic device integrated on a wafer, into electrical contact with corresponding channels of a testing apparatus which performs the working test thereof, in particular the electrical one, or the test in general.

The test, which is performed on integrated devices, is particularly useful to detect and isolate defective devices already in the manufacturing step. Usually, the probe cards are thus used for the electrical testing of devices that are integrated on wafers before cutting or separating and mounting them within a chip containment package.

A probe card comprises a testing head or probe head in turn including essentially a plurality of movable contact elements or contact probes provided with at least one end portion or contact tip for a corresponding plurality of contact pads of a device under test, also referred to as DUT (acronym of "Device Under Test"). The terms end or tip mean here and below an end portion, not necessarily being sharpened.

It is in particular known that the effectiveness and reliability of a measurement test depends, among other factors, also on the realization of a good electrical connection between device and testing apparatus, and therefore, on the establishment of an optimal electric contact probe/pad.

Among the types of testing heads used in the technical field here considered for the test of integrated circuits, testing heads having vertical probes are widely used, such testing heads being called "vertical probe heads". A vertical probe head comprises a plurality of contact probes retained by at least one couple of plates or guides, substantially plate-shaped and parallel to each other. These guides are provided with suitable holes and are arranged at a certain mutual distance, so as to leave a free zone or gap for the movement and the possible deformation of the contact probes. The couple of guides includes in particular an upper guide or upper die and a lower guide or lower die, both provided with guide holes within which the contact probes axially slide, such contact probes being usually made of wires of special alloys having good electrical and mechanical properties.

The good connection between the probes and the pads of the device under test is also in this case guaranteed by the pressure of the testing head on the device itself, the contact probes, which are movable within the guide holes realized in the upper and lower guides, undergoing a bending within the gap between the two guides during such pressing contact and also a sliding within those guide holes.

In addition, the bending of the contact probes in the gap can be assisted by a suitable configuration of the probes themselves or of their guides, in particular by using pre-deformed contact probes or suitably by transversally moving the guides supporting them.

It is also known to use testing heads whose probes are not fixedly fastened but are interfaced to a board, in turn connected to the testing apparatus: such testing heads are referred to as testing heads with unblocked probes.

In this case, the contact probes also have a further end portion or contact head towards a plurality of contact pads of such board. The good electrical contact between probes and board is guaranteed in a similar manner to the contact with the device under test by pressing the probes on the contact pads of the board.

The so-called testing heads with cantilever probes are also known, those testing heads having probes protruding as a fishing rod over a device under test.

In its most general form, a probe card, globally and schematically indicated with 10 in FIG. 1, comprises a testing head or probe head 1, such testing head 1 having non blocked vertical probes in the example of the Figure. The testing head 1 comprises a plurality of contact probes 2 contained in a body 3 of the head, in particular comprising at least one pair of plate-shaped supports or guides provided with respective guide holes adapted to house in a sliding manner the contact probes 2 that are not shown since of conventional kind.

Each contact probe 2 has an end or contact tip 2A abutting onto a contact pad of a device under test (not shown), by performing the mechanical and electrical contact between said device and a testing apparatus (also not shown) of which such testing head 1 is a terminal element.

In addition, each contact probe 2 has a further end, in practice indicated as contact head 2B, towards a plurality of contact pads 4A of an interfacing board 4. The good electrical contact between probes and board is ensured in a similar manner to the contact with the device under test by pressing the probes, in particular the respective contact heads 2B, on the contact pads 4A of the interfacing board 4.

More in particular, the interfacing board 4 is also used to perform a spatial transformation between the distribution of the contact pads 4A arranged at a first face F4a thereof, also referred to as "probe side", on which the contact heads 2B of the contact probes 2 abut, and corresponding contact pads arranged at a second and opposite face F4b, also indicated as "tester side", of the interfacing board 4, in particular for the connection with the printed circuit board 5 or PCB (acronym of "Printed Circuit Board") of connection with the testing apparatus.

According to its main function to perform a spatial transformation of the contact pads, with in particular a relaxation of the dimensional constraints related to the distances between pads, indicated as pitch, of the latest technologies, the interfacing board 4 is also usually indicated as space transformer. In other words, thanks to the use of the interfacing board 4 it is possible to realize the tester side contact pads 4B with a pitch greater than the one of the probe side contact pads 4A.

The interfacing board 4 can be realized by using the technique of the printed circuits, which allows to realize boards having active areas even of large dimensions, but with great limitations with respect to a minimum attainable value for the pitch between the contact pads on the device under test.

It is also known the ceramic based technology or MLC (acronym of "Multilayer Ceramic"). Such technology allows to achieve very small pitches and higher densities with respect to the PCB technology, but introduces limitations on the maximum number of signals that can be used for the test and on the maximum dimension of the active area that can be placed on the card.

It is possible to realize the interfacing board 4 even using a multilayered organic technology or MLO (acronym of "Multilayer Organic") or with a silicon or glass technology.

The spatial transformation operation inside the interfacing board 4 is performed by using a plurality of conductive tracks 6, in particular metallic, adapted to carry out the routing of the signals from the probe side contact pads 4A to the tester side contact pads 4B and from these latter, by means of suitable electrical contact structures 7, such as conductive balls, pins or pillars, to name a few, it is able to connect to the PCB 5. Even within the PCB 5 the routing of the signals is performed, through further conductive tracks 8, in particular metallic ones, in order to bring the signals outside of the probe card 10, and then to the testing apparatus. The conductive tracks 6 and 8 can be in practice even conductive planes as a whole.

Known probe cards also include suitable filtering capacitors 9. More particularly, it is known to use filtering capacitors 9 of ceramic type, including an insulating ceramic body 9c and suitable metal leads 9r arranged at the sides thereof, in order to form the plates of the capacitors themselves.

These filtering capacitors are commonly arranged on the first probe side face F4a of the interfacing board 4, at the outside of the testing head 1.

In order to ensure a better operation of the filtering capacitors 9, they are positioned as close as possible to the contact probes 2, in particular to probes which carry the power supply and the ground signals, to which the filtering is applied, and more in particular to their contact tips 2A.

In the most recent technologies, some filtering capacitors 9 are thus arranged also on the second tester side face F4b, in portions suitably not occupied by the electrical contact structures 7 in an area Aph in correspondence of the testing head 1.

In this way, the filtering capacitors 9 are more closer to the contact probes 2. However, this configuration leads to a parallel routing of the Power and Ground supplies within the interfacing board 4 in order to drive them to the sides of the board, outside the area Aph corresponding to the testing head 1.

This routing of the Power and Ground supplies inside the interfacing board leads to the realization of conductive tracks or planes 6 from the area Aph to an outside or peripheral area or the interfacing board 4, in addition to the conductive tracks or planes carrying the Power and Ground supplies to the filtering capacitors 9, arranged on different layers. All this results in the interfacing board 4 having a massive number of layers, increasing its thickness Sp4, with the immediate and obvious consequence of moving the filtering capacitors 9 themselves, arranged on the tester side, from the corresponding Power and Ground contact probes 2 and of a reduction of the relative filtering abilities.

Therefore even the latest solutions for the placement of the tester side filtering capacitors 9 in an area Aph corresponding to the testing head 1, deal with conflicting demands and are able only to get a compromise in terms of performance improvement thereof.

BRIEF SUMMARY

An embodiment of the disclosure is directed to a probe card apt to support a testing head equipped with a plurality of contact probes for the connection with a testing apparatus of electronic devices, in particular integrated on wafers, having structural and functional characteristics such as to overcome the limitations and drawbacks still affecting the probe cards manufactured according to the known technologies, in particular allowing to improve the performance of the filtering capacitors that are used in particular for the contact probes carrying supply signals, without an excessive structural complication of the card itself.

In particular, conductive portions of the filtering capacitors arranged on the interfacing board are used as an element of electrical connection with the PCB, thanks to a suitable sizing thereof, while realizing a mechanic support for the PCB itself.

According to another embodiment, the probe card for a testing apparatus of electronic devices comprises at least one testing head which houses a plurality of contact probes, each contact probe having at least one contact tip adapted to abut onto contact pads of a device under test, and also at least one space transformer adapted to provide a spatial transformation of the distances between contact pads made on its opposite sides and connected by means of suitable conductive tracks or planes, as well as a plurality of filtering capacitors provided between the space transformer and a PCB, wherein the PCB includes direct conductive tracks or planes contacting conductive portions of the filtering capacitors.

According to yet another aspect of the disclosure, the space transformer may comprise conductive tracks or planes contacting the conductive portions of the filtering capacitors, the combination of the conductive tracks or planes, of the direct conductive tracks or planes and of the conductive portions allowing a transmission of signals between the testing head and the PCB.

In particular, heights of the filtering capacitors can be substantially equal to each other between the space transformer and the PCB.

In addition, the heights of the filtering capacitors can be comparable to heights of further electrical contact structures arranged between the space transformer and the PCB.

According to another aspect of the disclosure, the conductive portions may be metal leads of the filtering capacitors.

Additionally, the filtering capacitors can be provided in correspondence of contact probes carrying supply signals.

According to another aspect of the disclosure, the filtering capacitors can be provided inside an area of the space transformer facing the testing head.

According to yet another aspect of the disclosure, the probe card may comprise further filtering capacitors provided outside an area of the space transformer corresponding to the testing head and on a side facing the testing head.

In particular, the filtering capacitors can be ceramic or silicon based capacitors.

According to another aspect of the disclosure, the filtering capacitors can be soldered to the space transformer, in correspondence of contact pads of the space transformer facing the PCB.

According to still another aspect of the disclosure, the probe card may further comprise a conductive flexible interface, such as a conductive silicone rubber, adapted to provide an electrical interconnection by pressure between the space transformer and the PCB.

In particular, the conductive flexible interface can be shaped so as to compensate for height differences between the filter capacitors and possible electrical contact structures included between the space transformer and the PCB.

Furthermore, the filtering capacitors and the possible electrical contact structures between the space transformer and the PCB may include surface portions having an improved electrical contact, particularly being gold-plated.

According to another aspect of the disclosure, the probe card may comprise a plurality of space transformers adapted to provide a plurality of spatial transformation levels, interconnected to each other by means of a plurality of interconnecting levels and arranged between the testing head and the PCB, each interconnecting level comprising a respective plurality of filtering capacitors and possible respective electrical contact structures.

Finally, each space transformer may comprise respective conductive tracks or planes that connect respective metal portions of the filtering capacitors.

The characteristics and advantages of the probe card according to the disclosure will become apparent from the description, which is made hereafter, of an embodiment thereof, given by way of non-limiting example with reference to the accompanying drawings.

DETAILED DESCRIPTION

Figure 2:
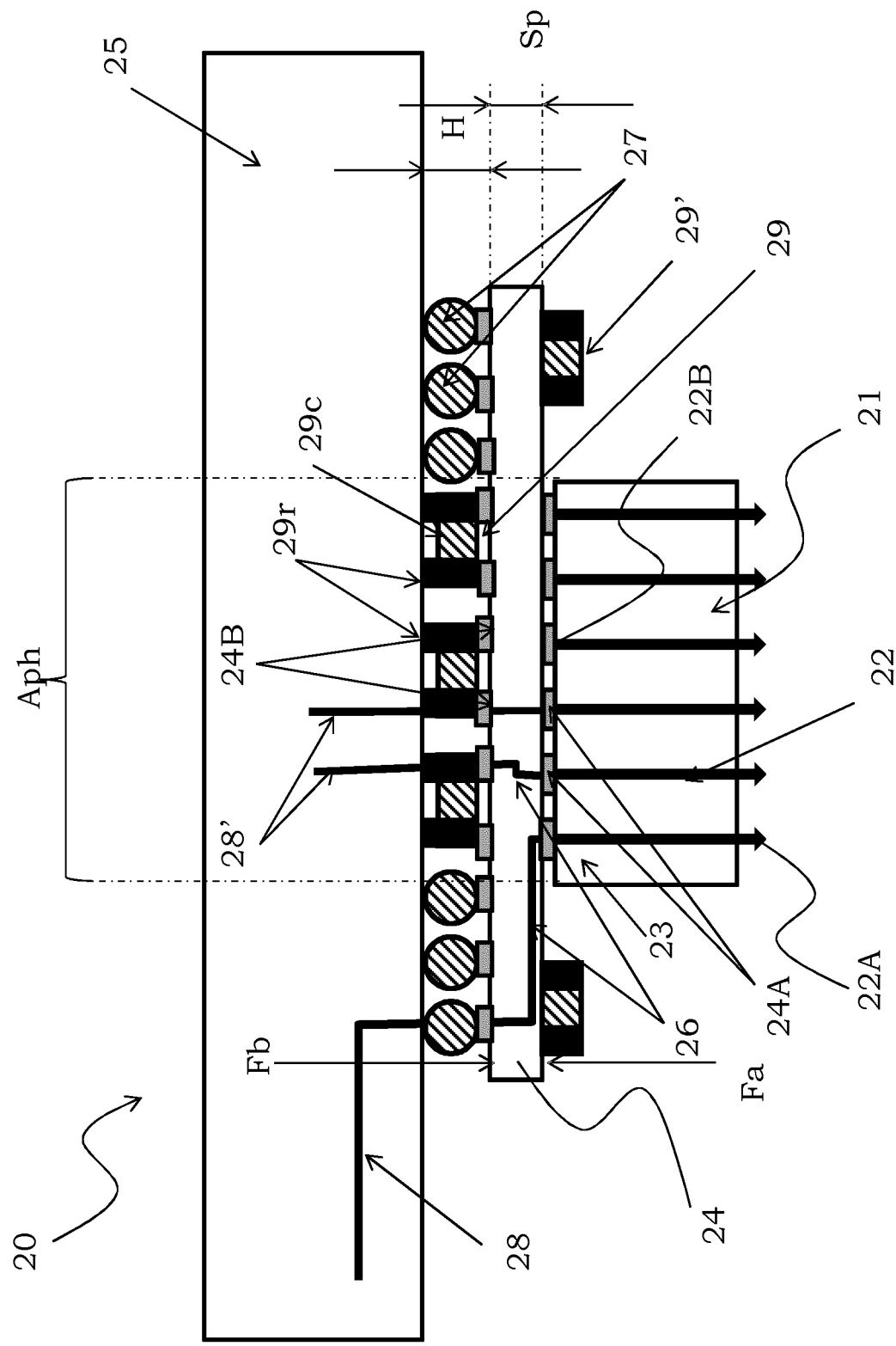
FIGS. 2, 3 and 4 schematically show a probe card according to various embodiments of the disclosure.

With reference to such Figures, and in particular to FIG. 2, a probe card comprising at least one testing head or probe head 21 provided with a plurality of contact probes for testing electronic devices, in particular integrated on wafers, is globally indicated with 20.

It should be noted that the Figures represent schematic views of the card according to the disclosure and are not drawn to scale, but instead they are drawn so as to emphasize the important features of the disclosure.

Moreover, the different aspects of the disclosure represented by way of example in the Figures can be obviously mutually combined and interchanged from one embodiment to another.

In particular, as illustrated in FIG. 2, the probe card 20 comprises a probe head 21 that houses a plurality of contact probes 22 within a containment body or case 23.

Figure 1:
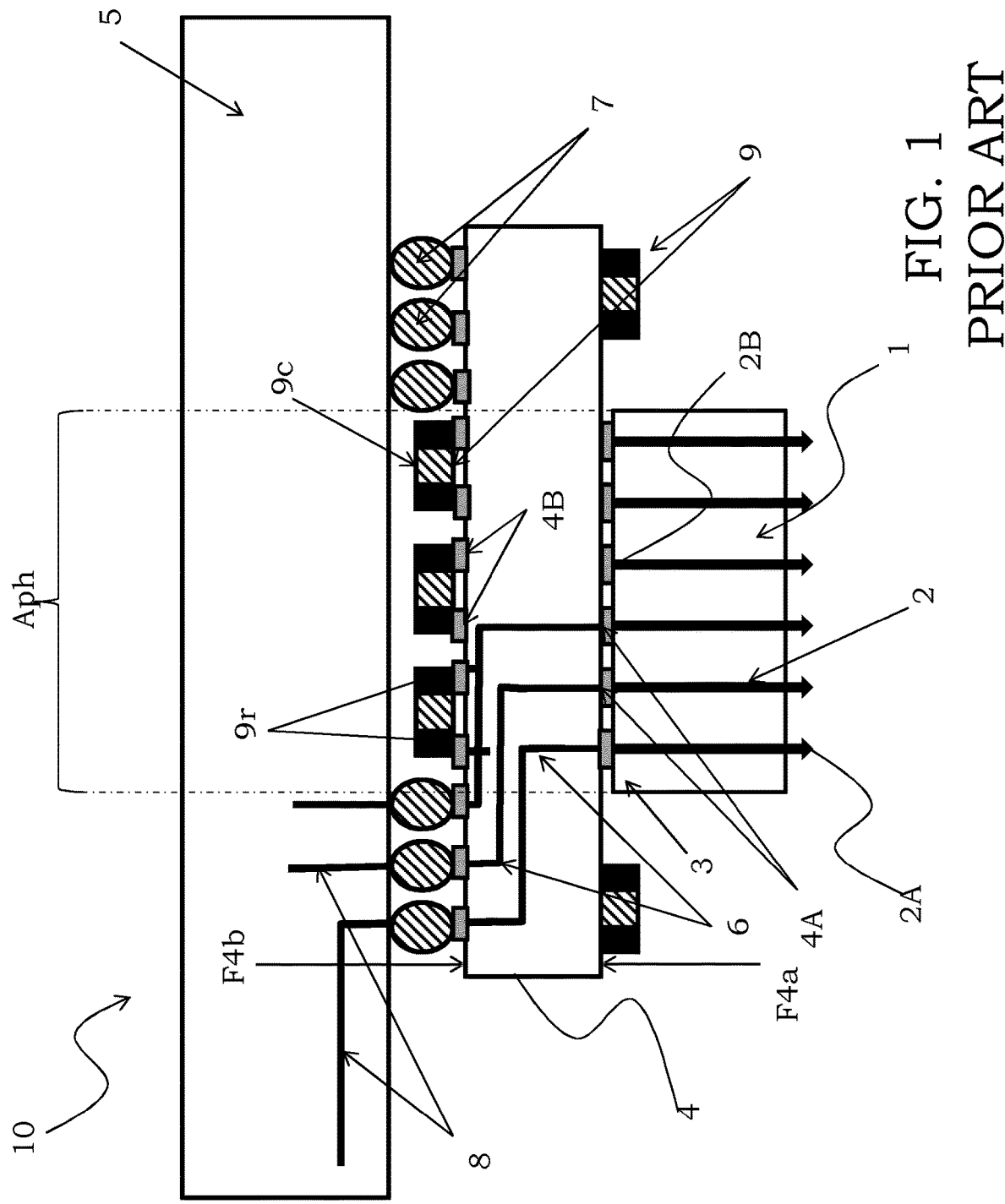
FIG. 1 schematically shows a probe card apt to support a testing head having vertical probes according to the prior art.

As already stated with reference to FIG. 1 of the prior art, the illustrated probe head 21 is of the unblocked vertical probe type, wherein the probes are held by at least one pair of plate-shaped supports or guides provided with respective guide holes adapted to house them in a sliding way.

It is also possible to use a probe head of micromechanical type, such as the so-called micro-cantilever probe heads, having probes directly welded to a support, the disclosure not being limited to a particular type of probe head.

In the illustrated case, each contact probe 22 comprises an end or contact tip 22A abutting onto a corresponding contact pad of a device under test (not shown), realizing the mechanical and electrical contact between the device and a testing apparatus (also not shown), as well as a further end or contact head 22B apt to abut onto a corresponding contact pad 24A of an interfacing board. The interfacing board is in particular apt to perform a spatial transformation between the distribution of a plurality of contact pads 24A arranged at a first face Fa thereof, also referred to as "probe side", onto which the contact heads 22B of the contact probes 22 abut, and of a plurality of contact pads 24B arranged at a second and opposite face Fb thereof, also indicated as "tester side"; for this reason, the interfacing board is here and hereinafter referred to as space transformer 24, according to a well known terminology used in the field.

The tester side contact pads 24B are used in particular for the connection with the printed circuit board or PCB 25 and thus with the testing apparatus.

A plurality of conductive tracks or planes 26, in particular metallic, is provided within the space transformer 24, those conductive tracks or planes 26 being adapted to perform a re-direction or routing of the signals between the probe side contact pads 24A and the tester side contact pads 24B, and then to the PCB 25, by means of electrical contact structures 27, such as conductive balls, pins or pillars, to name a few, suitably arranged between the space transformer 24 and the PCB 25 and in contact with both the space transformer 24 and the PCB 25. As previously, as electrical contact structures it is possible to provide conductive balls, pins or pillars.

Further conductive tracks or planes 28, in particular metallic, are provided within the PCB 25 for routing the signals to the outside thereof, in particular towards the testing apparatus to which this PCB 25 is connected.

The probe card 20 also includes suitable filtering capacitors 29 arranged on the tester side second face Fb of the space transformer 24 in correspondence of an area Aph below which the probe head 21 is arranged, according to the local reference system of the Figure.

The filtering capacitors 29 in particular comprise a body 29c, for example of ceramic type, and conductive portions or metal leads 29r arranged at the sides of that body 29c in order to realize the plates of the filtering capacitors 29. Alternatively, it is possible to use silicon-based capacitors.

Advantageously according to the present disclosure, the filtering capacitors 29 are sized in such a way that the respective metal leads 29r are in contact with both tester side contact pads 24B and the PCB 25.

In particular, filtering capacitors 29 are used with equal mutual heights and comparable to those of the electrical contact structures 27 connected between the space transformer 24 and the PCB 25; this height is shown in the Figure as H, where the term "comparable heights" means heights with values having a deviation less than 20%.

It is underlined in this regard that, thanks to the suitable sizing and connection of the filtering capacitors 29, the filtering capacitors 29 at the same time are acting as filtering elements of the signals, with improved efficiency as will be explained in more detail below, and are acting as connecting elements between two substrates, in particular the space transformer 24 and the PCB 25, in the manner of the electrical contact structures 27.

In addition, the probe card 20 comprises suitable direct conductive tracks or planes 28' in contact with the metallic portions, in particular the metal leads 29r, such direct conductive tracks or planes 28' realizing a conductive path between one side and the other of each capacitor and are in particular adapted to carry out the routing of the signals, in particular of the contact probes 22 already connected to the filtering capacitors 29. These contact probes 22 are in particular probes for voltage references, in particular carrying Power and Ground supply signals, which probes, as it is known, are mostly subjected to frequency performance problems and therefore use filtering capacitors 29.

Substantially, the metal leads 29r of the filtering capacitors 29 in this case suitably also perform the function of the electrical contact structures 27 and transmit signals to the PCB 25.

Advantageously according to the present disclosure, it is thus possible to reduce the number of layers to use within the space transformer 24 in order to perform the routing of the signals from the tester side contact pads 24B to the PCB 25. The routing itself is also simplified within the space transformer 24 since it is not necessary to carry the Power and Ground supply signals outside the area Aph corresponding to the probe head 21.

This reduction of the number of layers required for routing the signals within the space transformer 24 has the immediate consequence of reducing the thickness thereof, which thickness is indicated in FIG. 2 as Sp, and then the filtering capacitors 29 are thus closer to the contact probes 22 and to the device under test, so increasing the performances especially at high frequency.

Tests carried out by the Applicant itself have proven that, thanks to the use of the filtering capacitors 29 as electrical connecting elements, it is possible to reduce the thickness of the space transformer 24 up to 70%, for example from 2 mm to 600-700 microns, thus making the filtering capacitors 29 closer to the contact tips 22A of the contact probes 22 and to the device under test, in particular three times closer compared to the currently distance reachable with the known solutions.

It was also verified that the probe card 20 according to the present disclosure allows to double the frequency performances with respect to the known solutions, as for example in the case of the probe card illustrated in FIG. 1, improving the frequency performances, in particular reducing the impedance at high frequency.

It is also possible to reduce the number of the electrical contact structures 27, since it is no longer necessary to use the ones that, in the known probe cards, were intended to perform the connection for the Power and Ground supplies.

The probe card 20 may also include additional filtering capacitors 29', again for example of ceramic type or made of silicon, positioned on the probe side first face Fa of the space transformer 24, in an area that is external to the area Aph corresponding to the probe head 21. These additional filtering capacitors 29', since they are more spaced from the contact probes 22 with respect to the filtering capacitors 29, may be used for example for filtering the low frequency components of signals and supplies, limiting the number of signals that the filtering capacitors 29 filters and thereby enhancing the efficiency of the probe card 20 as a whole.

Obviously, the proposed solution involves to carry out a routing of signals inside the PCB 25 in order to allow the correct outlet of the supplies. However, this additional routing is located downstream of the filtering capacitors 29 and therefore it does not affect their performances.

The space transformer 24 can be realized, as in the known probe cards, using the technique of the printed circuits, the ceramic-based technology or MLC, the multi-layer organic technology or MLO or the silicon or glass technology.

In general, the metal leads 29r are realized by means of an external metallization of a ceramic or silicon body 29c of the capacitor; subsequently, for example by means of welding, direct conductive tracks or planes 28' are made in order to connect the signals of interest.

In particular, in the embodiment illustrated in FIG. 2, the filtering capacitors 29 are welded both to the space transformer 24, in correspondence of the tester side contact pads 24B, and to the PCB 25. Also in correspondence of the PCB 25 it is possible to realize contact pads, not shown.

It is underlined that, since the welding material is usually a tin alloy or a low melting point alloy whose height can be controlled, it is possible to recover small differences in height between the filtering capacitors 29 and electrical contact structures 27 with a suitable planarization of a layer of this welding material, before making the connection with the PCB 25.

Figure 3:
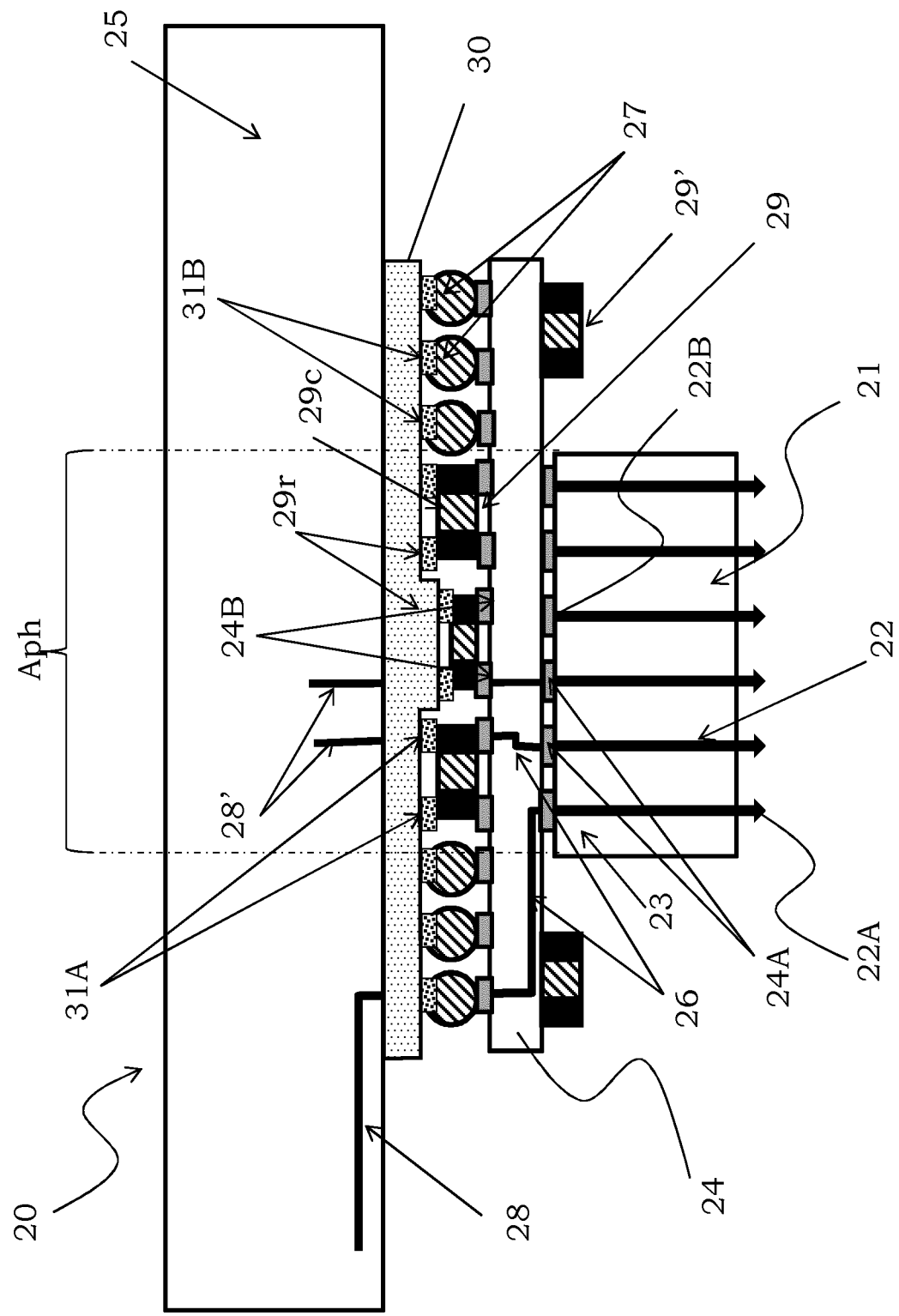

In an alternative embodiment schematically illustrated in FIG. 3, the probe card 20 comprises, as an alternative to the welding, a conductive flexible interface 30, for example a conductive silicone rubber, adapted to provide an electrical interconnection by pressure; this conductive flexible interface 30 substantially realizes a flexible contact system with the PCB 25.

More in particular, the conductive flexible interface, for example having the shape of a conductive silicone rubber, is arranged between the filtering capacitors 29 and the electrical contact structures 27 and the PCB 25 and, once pressed, it performs the connection with the direct conductive tracks or planes 28' of the PCB 25.

It is emphasized that, in such a case and as shown schematically in FIG. 3, the filtering capacitors 29 and the electrical contact structures 27 may have a different height, or a not comparable height, any height difference being compensated in a simple way by suitably shaping the conductive flexible interface 30, such as a conductive silicone rubber.

In other words, the use of a shaped conductive flexible interface 30, as a shaped conductive silicone rubber, makes it possible to use filtering capacitors 29 having different heights between each other and with respect to the electrical contact structures 27, and possibly also the use of electrical contact structures 27 having height different from one another, eliminating another constraint in the design of the probe card 20.

Furthermore, it is possible to improve the contact with the conductive flexible interface 30, such as a conductive silicone rubber, by means of a suitable plating of the surfaces exposed to the same conductive flexible interface 30, such as a conductive silicone rubber, of the filtering capacitors 29 and of the electrical contact structures 27, by realizing respective surface portions 31A and 31B having an improved electrical contact; more particularly, the surface portions 31A and 31B are suitably gold plated and are able to ensure a proper and continuous contact also with a pressure system as the conductive flexible interface 30, for example in the shape of a conductive silicone rubber.

Even in such a case it is possible to provide the realization of a plurality of contact pads (not shown) on the PCB 25 in correspondence of the surface portions 31A and 31B.

Figure 4:
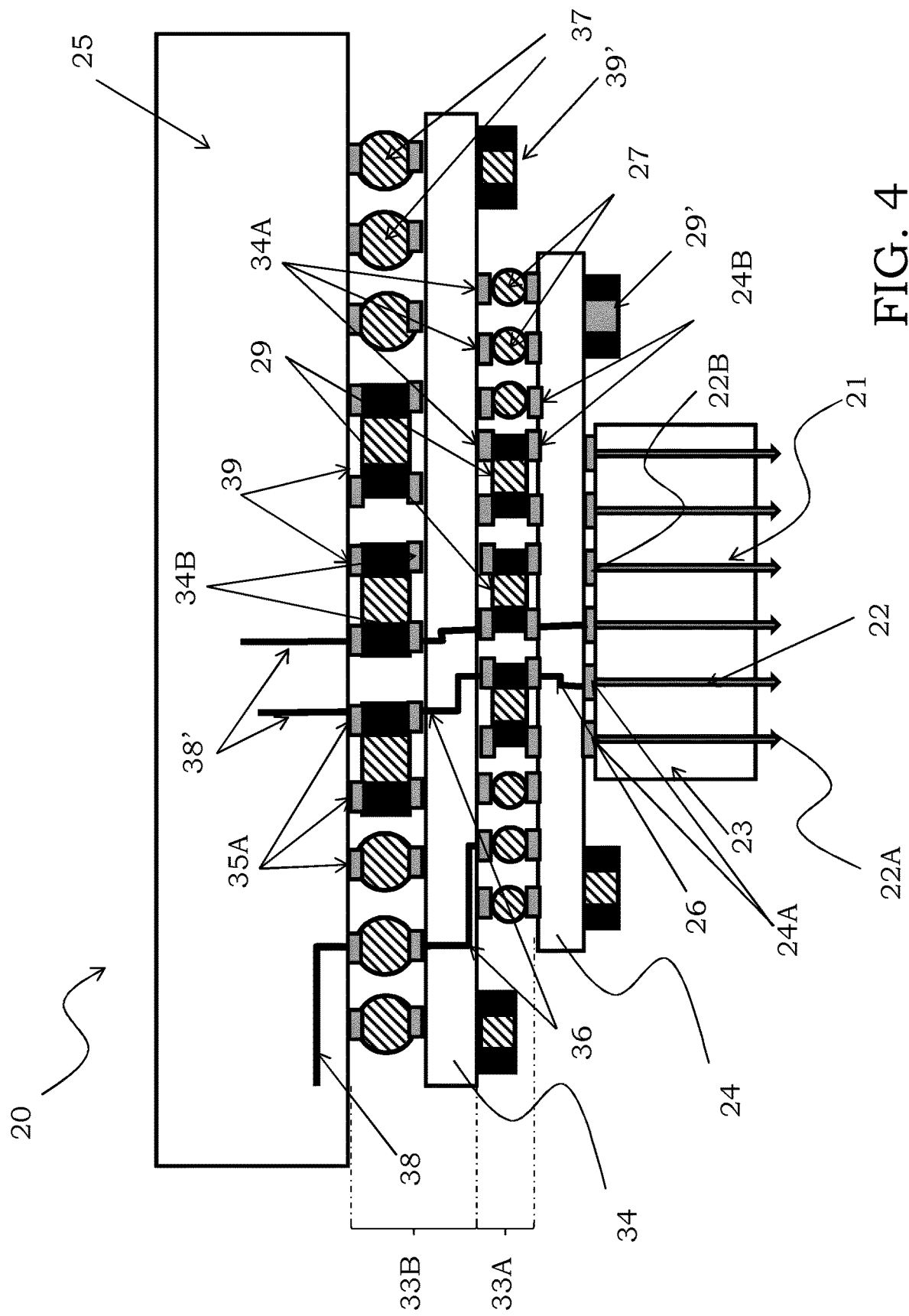

According to a further alternative embodiment, illustrated schematically in FIG. 4, the probe card 20 can be realized by means of a plurality of spatial transformation levels, for example two levels are shown in the Figure. In such a case the probe card 20 thus comprises the space transformer 24 and at least one further space transformer 34, which are interconnected to each other and arranged between the probe head 21 and the PCB 25. The further space transformer 34 is also referred to as interposer.

More in particular, the probe card 20 comprises at least one first interconnecting level 33A, realized by means of the filtering capacitors 29 and the electrical contact structures 27 and arranged between the space transformer 24 and the further space transformer 34, and a second interconnecting level 33B, realized by means of further filtering capacitors 39 and further electrical contact structures 37 and arranged between the further space transformer 34 and the PCB 25. Furthermore, as previously, the space transformer 24 comprises a plurality of probe side contact pads 24A for the connection with the probe head 21. Additionally, the space transformer 24 comprises a plurality of tester side contact pads 24B in correspondence of the filtering capacitors 29 and of the electrical contact structures 27 of the first interconnecting level 33A. Also the further filtering capacitors 39 have respective conductive portions 39r, in particular metallic leads, the capacitors being preferably ceramic or silicon based.

In the embodiment illustrated in FIG. 4, the further space transformer 34 is in turn provided with a plurality of contact pads 34A facing the space transformer 24 and indicated as probe side, and a plurality of contact pads 34B facing the PCB 25 and indicated as tester side. Additionally, the PCB 25 may in turn comprise a plurality of contact pads 35A, in correspondence of the further filtering capacitors 39 and of the further electrical contact structures 37 of the second interconnecting level 33B.

As previously, within the space transformer 24 a plurality of conductive tracks or planes 26 is provided, the conductive tracks or planes 26 being adapted to perform a re-direction or routing of the signals between the probe side contact pads 24A and the tester side contact pads 24B and then to the further space transformer 34, due to the filtering capacitors 29 and the electrical contact structures 27 of the first interconnecting level 33A.

Further conductive tracks or planes 38, in particular metallic ones, are provided within the PCB 25 for the routing of the signals to the outside thereof, in particular towards the testing apparatus to which this PCB 25 is connected.

Suitably, according to this alternative embodiment, the probe card 20 also comprises further conductive tracks or planes 36, in particular metallic, made inside the further space transformer 34 in order to perform a re-direction or routing of the signals between the probe side contact pads 34A and the tester side contact pads 34B of the further space transformer 34. The further conductive tracks or planes 36 are made so as to connect filtering capacitors 29 of the first interconnecting level 33A with further filtering capacitors 39 of the second interconnecting level 33B, as well as to connect electrical contact structures 27 of the first interconnecting level 33A with further electrical contact structures 37 of the second interconnecting level 33B.

Finally, the probe card 20 includes suitable direct conductive tracks or planes 38' in contact with the further filtering capacitors 39, in particular with their metallic leads, so as to perform the routing of the signals of the contact probes 22 connected thereto through the filtering capacitors 29.

In this way it will be possible to further improve the performance of the probe card 20 by using the filtering capacitors 29 realized closer to the probe head 21 or "probe side" in order to filter signal components of higher frequency and by using the further filtering capacitors 39 realized closer to the PCB 25 or "tester side" in order to filter signal components of lower frequency.

To give an order of magnitude by way of a non limiting example, it is considered that for a Power supply it is possible to provide a first spatial transformation at the space transformer 24, substantially in order to reach the pitch of the filtering capacitors 29, from 500 contact probes to 80 capacitors, as well as a second spatial transformation at the further space transformer 34, where it is also possible to provide also the use of larger filtering capacitors 39.

As previously, it is possible to use one or more conductive silicone rubbers to provide electrical interconnections by pressure between the different space transformers and the PCB 25, the different space transformers being in mutual electrical interconnection, as well as a suitable plating of the surfaces exposed to the same conductive flexible interface 30, such as a conductive silicone rubber, of the filtering capacitors 29, 39 and of the electrical contact structures 27, 37, with the realization of respective surface portions having improved electrical contact, in particular being gold-plated.

It is obviously possible to use a plurality of space transformers suitably interconnected to each other by means of further interconnecting levels, at least one space transformer 24 being connected to the probe head 21.

It is emphasized that, thanks to the subdivision of the spatial transformation on multiple levels and to the use of multiple space transformers, it is possible to reduce the height or thickness of such space transformers. This reduction, in particular in correspondence of the space transformer 24 connected to the probe head 21, allows to further improve the filtering effect of the filtering capacitors 29 that are further closer to the supply contact probes 22 and to the device under test.

The use of only two space transformers, as shown in FIG. 4, allows to halve the thickness of the space transformer 24 and then to approach 70% of the filtering capacitors 29 to the contact probes 22 of the supplies.

In conclusion, advantageously according to the disclosure, it is obtained a probe card having improved performances in terms of filtering of signals, in particular of Power and Ground supply signals, and as such able to improve the frequency performances of the card, by reducing its high frequency impedance.

It is also underlined that, by using the electrical connection performed by the leads of the filtering capacitors, it is possible to reduce the number of lateral electrical contact structures, such as conductive balls, previously used for the routing of the signals driven also to the filtering capacitors, to reduce the number of layers realizing the space transformer(s), thanks to the simplification of the routing to be carried out, and also to reduce the number of capacitors to be used, thanks to their approach to the probe head.

In particular, the simplified routing within the space transformer allows to reduce the number of layers of the space transformer and then the thickness thereof, the filtering capacitors being thus closer to the contact probes of the power supplies and to the device and test, increasing the frequency performances of the probe card so obtained.

Moreover, thanks to the suitable sizing and connection of the filtering capacitors, at the same time they act as filtering elements of the signals, with improved efficiency due to the approaching to the contact probes of the supplies and in particular to the probe head, and act as elements of connection between two substrates, in particular the space transformer and the PCB, in the manner of the electrical contact structures, such as conductive balls.

In particular, the metallic leads of the filtering capacitors, suitably contacted by direct conductive tracks or planes, in such a case also perform the connection previously performed by the electrical contact structures and transmit signals to the PCB.

It is in particular verified that the probe card according to the present disclosure allows to more than double the frequency performances with respect to the known solutions.

In the case of the use of a conductive flexible interface, for example in the shape of a conductive silicone rubber, able to make an electrical interconnection by pressure, it is possible to realize a flexible contact system with the PCB, adapted to compensate for any unevenness simply by suitably shaping the flexible interface itself, possibly improved by means of an appropriate plating of the exposed surfaces of the filtering capacitors and of the electrical contact structures towards the conductive flexible interface.

Finally, advantageously according to the present disclosure, the probe card may comprise a plurality of space transformers that realize a plurality of spatial transformation levels, so as to further improve the performance of the probe card by using the filtering capacitors made closer to the probe head, or "probe side", in order to filter signal components of higher frequency, and by using the further filtering capacitors made closer to the PCB, or "tester side", in order to filter signal components of lower frequency. It is also possible in this case to use space transformers having reduced thicknesses or heights so making the "probe side" filtering capacitors closer to the contact probes of the supplies and to the device under test.

From the foregoing it will be appreciated that, although specific embodiments of the disclosure have been described herein for purposes of illustration, various modifications may be made without deviating from the spirit and scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A probe card for a testing apparatus of electronic devices, comprising:
   a testing head housing a plurality of contact probes having respective contact tips configured to abut onto contact pads of a device under test,
   a space transformer comprising:
      first contact pads made on a first side of the space transformer;
      second contact pads made on a second side, opposite to the first side, of the space transformer; and
      conductive tracks or planes connecting at least some of the first contact pads to the second contact pads, the space transformer realizing a spatial transformation of distances between the first contact pads and distances between the second contact pads,
   a printed circuit board (PCB), and
   a first plurality of filtering capacitors positioned between the space transformer and the PCB,
   wherein the PCB comprises direct conductive tracks or planes directly electrically contacting conductive portions of the filtering capacitors, and at least some of the conductive tracks or planes of the space transformer electrically contact the conductive portions of the filtering capacitors, and at least some of the conductive portions of the filter capacitors provide a conductive path from the conductive tracks or planes of the space transformer to the direct conductive tracks or planes of the PCB.

2. The probe card of claim 1, wherein heights of the filtering capacitors are substantially equal to each other between the space transformer and the PCB.

3. The probe card of claim 2, wherein the heights of the filtering capacitors are comparable to heights of further electrical contact structures realized between the space transformer and the PCB.

4. The probe card of claim 1, wherein the conductive portions are metal leads of the filtering capacitors.

5. The probe card of claim 1, wherein the filtering capacitors are realized in correspondence of contact probes, of the plurality of contact probes, carrying supply signals.

6. The probe card of claim 1, further comprising a second plurality of filtering capacitors realized inside an area of the space transformer facing the testing head.

7. The probe card of claim 1, further comprising:
   a third plurality of filtering capacitors realized outside an area of the space transformer corresponding to the testing head and on the first side which faces the testing head.

8. The probe card of claim 1, wherein the filtering capacitors are chosen between ceramic and silicon based capacitors.

9. The probe card of claim 1, wherein the filtering capacitors are soldered to the space transformer, in correspondence with at least some of the second contact pads of the space transformer, which face the PCB.

10. The probe card of claim 1, further comprising a plurality of interconnecting levels, wherein:
    the space transformer is one of a plurality of space transformers realizing a plurality of spatial transformation levels,
    the space transformers are interconnected to each other by the plurality of interconnecting levels and are arranged between the testing head and the PCB,
    the first plurality of filtering capacitors is one plurality of plural pluralities of filtering capacitors, each interconnecting level comprising a respective plurality of the plural pluralities of filtering capacitors and respective electrical contact structures.

11. The probe card of claim 10, wherein each of the space transformers comprises respective conductive tracks or planes connecting respective metal portions of the filtering capacitors.

12. A probe card for a testing apparatus of electronic devices, comprising:
    a testing head housing a plurality of contact probes having respective contact tips configured to abut onto contact pads of a device under test;
    a space transformer comprising:
       first contact pads made on a first side of the space transformer;
       second contact pads made on a second side, opposite to the first side, of the space transformer; and
       conductive tracks or planes connecting at least some of the first contact pads to the second contact pads,
       the space transformer realizing a spatial transformation of distances between the first contact pads and distances between the second contact pads,
    a printed circuit board (PCB),
    a first plurality of filtering capacitors positioned between the space transformer and the PCB, wherein the PCB comprises direct conductive tracks or planes electrically contacting conductive portions of the filtering capacitors; and
    a conductive flexible interface electrically interconnecting the space transformer and the PCB by pressure.

13. The probe card of claim 12, wherein the conductive flexible interface electrically interconnects the conductive portions of the filtering capacitors to the conductive tracks or planes of the PCB.

14. The probe card of claim 12, wherein the conductive flexible interface is a conductive silicone rubber.

15. The probe card of claim 12, wherein the conductive flexible interface has a shape that compensates height differences between the filtering capacitors and electrical contact structures included between the space transformer and the PCB.

16. The probe card of claim 12, wherein the filtering capacitors and the electrical contact structures between the space transformer and the PCB comprise surface portions having an improved electrical contact.

17. The probe card of claim 14, wherein the surface portions having an improved electrical contact are gold-plated.

18. A probe card for a testing apparatus of electronic devices comprising:
   a testing head housing a plurality of contact probes having respective contact tips configured to abut onto contact pads of a device under test,
   a space transformer comprising:
      first contact pads made on a first side of the space transformer;
      second contact pads made on a second side, opposite to the first side, of the space transformer; and
      conductive tracks or planes connecting at least some of the first contact pads to the second contact pads,
      the space transformer realizing a spatial transformation of distances between the first contact pads and distances between the second contact pads,
   a printed circuit board (PCB), and
   a first plurality of filtering capacitors positioned between the space transformer and the PCB, each filtering capacitor comprising a body and conductive portions arranged at sides of the body, the conductive portions electrically contacting the conductive tracks or planes,
   wherein the PCB comprises conductive tracks or planes that directly electrically contact the conductive portions of the filtering capacitors, and at least some of the conductive portions of the filter capacitors provide a conductive path from the conductive tracks or planes of the space transformer to the direct conductive tracks or planes of the PCB.

19. The probe card of claim 18, wherein heights of the filtering capacitors are substantially equal to each other between the space transformer and the PCB.

20. The probe card of claim 19, further comprising:
   electrical contact structures arranged between the space transformer and the PCB,
   the heights of the filtering capacitors being comparable to heights of the electrical contact structures.

21. The probe card of claim 18, wherein the conductive portions are metal leads of the filtering capacitors.

22. The probe card of claim 18, wherein the filtering capacitors are realized in correspondence of contact probes, of the plurality of contact probes, carrying supply signals.

23. The probe card of claim 18, further comprising a second plurality of filtering capacitors realized inside an area of the space transformer facing the testing head.

24. The probe card of claim 23, further comprising:
   a third plurality of filtering capacitors provided outside the area and on the first side which faces the testing head.

25. The probe card of claim 18, wherein the filtering capacitors are chosen between ceramic and silicon based capacitors.

26. The probe card of claim 18, wherein the filtering capacitors are soldered to the space transformer, in correspondence with at least some of the second contact pads of the space transformer, which face the PCB.

* * * * *